United States Patent
Li et al.

(10) Patent No.: US 11,096,302 B2
(45) Date of Patent: Aug. 17, 2021

(54) SERVER

(71) Applicant: HONGFUJIN PRECISION ELECTRONICS (TIANJIN) CO., LTD., Tianjin (CN)

(72) Inventors: Han-Yu Li, New Taipei (TW); Ya-Ni Zhang, Tianjin (CN); Fang-Xing Yang, Tianjin (CN); Gong-Wen Zhang, Tianjin (CN); Yang Li, Tianjin (CN); Zhao-Hui Zhen, Tianjin (CN); Hong-Shuo Li, Tianjin (CN)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 0 days.

(21) Appl. No.: 16/816,389

(22) Filed: Mar. 12, 2020

(65) Prior Publication Data
US 2021/0212232 A1  Jul. 8, 2021

(30) Foreign Application Priority Data
Jan. 8, 2020  (CN) .......................... 202010016394.5

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/14* | (2006.01) | |
| *H05K 5/03* | (2006.01) | |
| *H05K 7/20* | (2006.01) | |
| *H05K 5/02* | (2006.01) | |

(52) U.S. Cl.
CPC ......... *H05K 7/1427* (2013.01); *H05K 5/0269* (2013.01); *H05K 5/03* (2013.01); *H05K 7/1417* (2013.01); *H05K 7/20254* (2013.01); *H05K 7/20272* (2013.01)

(58) Field of Classification Search
CPC ............... H05K 7/1427; H05K 7/1417; H05K 7/20254; H05K 7/20272; H05K 7/20218; H05K 7/20709; H05K 7/20763; H05K 7/208; H05K 5/0269; H05K 5/03
USPC .................................................. 361/725–727
See application file for complete search history.

(56) References Cited

U.S. PATENT DOCUMENTS

| | | | | |
|---|---|---|---|---|
| 9,380,728 | B1 * | 6/2016 | Dunwoody | .......... H05K 7/1487 |
| 2011/0056675 | A1 * | 3/2011 | Barringer | ........... H05K 7/20736 165/299 |
| 2013/0105139 | A1 * | 5/2013 | Campbell | .......... H05K 7/20263 165/300 |
| 2016/0286689 | A1 * | 9/2016 | Wu | ........................... G06F 1/20 |

(Continued)

FOREIGN PATENT DOCUMENTS

| | | |
|---|---|---|
| CN | 207589354 U | 7/2018 |
| TW | 201419994 A | 5/2014 |

*Primary Examiner* — Anthony M Haughton
(74) *Attorney, Agent, or Firm* — ScienBiziP, P.C.

(57) ABSTRACT

A server includes a case, a mounting frame, a heating element, a connecting plate, and a cooling mechanism. The heating element, the connecting plate, and the cooling mechanism are mounted on the mounting frame. The heating element is detachably mounted on the connecting plate. The cooling mechanism is coupled to the heating element. The mounting frame is detachably mounted in the case. The connecting plate includes a plug portion configured to plug with an operating mechanism mounted in the case.

16 Claims, 6 Drawing Sheets

(56) References Cited

U.S. PATENT DOCUMENTS

| | | | |
|---|---|---|---|
| 2017/0049010 A1* | 2/2017 | Campbell | H05K 7/20709 |
| 2018/0249590 A1* | 8/2018 | Hayashi | H05K 7/202 |
| 2020/0249732 A1* | 8/2020 | Nakamura | H05K 7/20 |
| 2020/0352051 A1* | 11/2020 | He | F04D 29/4246 |

* cited by examiner

SERVER

FIELD

The subject matter herein generally relates to servers, and more particularly to a server having a removable mounting frame.

BACKGROUND

Generally, a server is equipped with multiple heat-generating elements, such as a graphics processing unit, and the server is mounted in a cabinet. When the heat-generating elements need to be maintained, the entire server needs to be removed from the cabinet, which is inconvenient.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIGS. 1-5 show an embodiment of a server 100 applicable on a cabinet and used for providing calculations for large devices. The server 100 includes a mounting frame 10, a heating element 20, a cooling mechanism 30, a connecting plate 40 (shown in FIG. 4), and a case 50. The heating element 20, the cooling mechanism 30, and the connecting plate 40 are located on the mounting frame 10. The heating element 20 is detachably connected to the connecting plate 40. The cooling mechanism 30 is connected to the heating element 20. The mounting frame 10 is detachably mounted in the case 50. The connecting plate 40 includes a plug portion 41. The plug portion 41 is plugged with an operating mechanism 53 provided in the case 50.

The mounting frame 10 is detachably mounted in the case 50, so that the mounting frame 10 can be detached from the case 50 when the heating element 20 needs to be repaired. The cooling mechanism 30 is configured to dissipate heat from the heating element 20 located in the case 50, thereby improving heat dissipation efficiency of the heating element 20.

Figure 4:
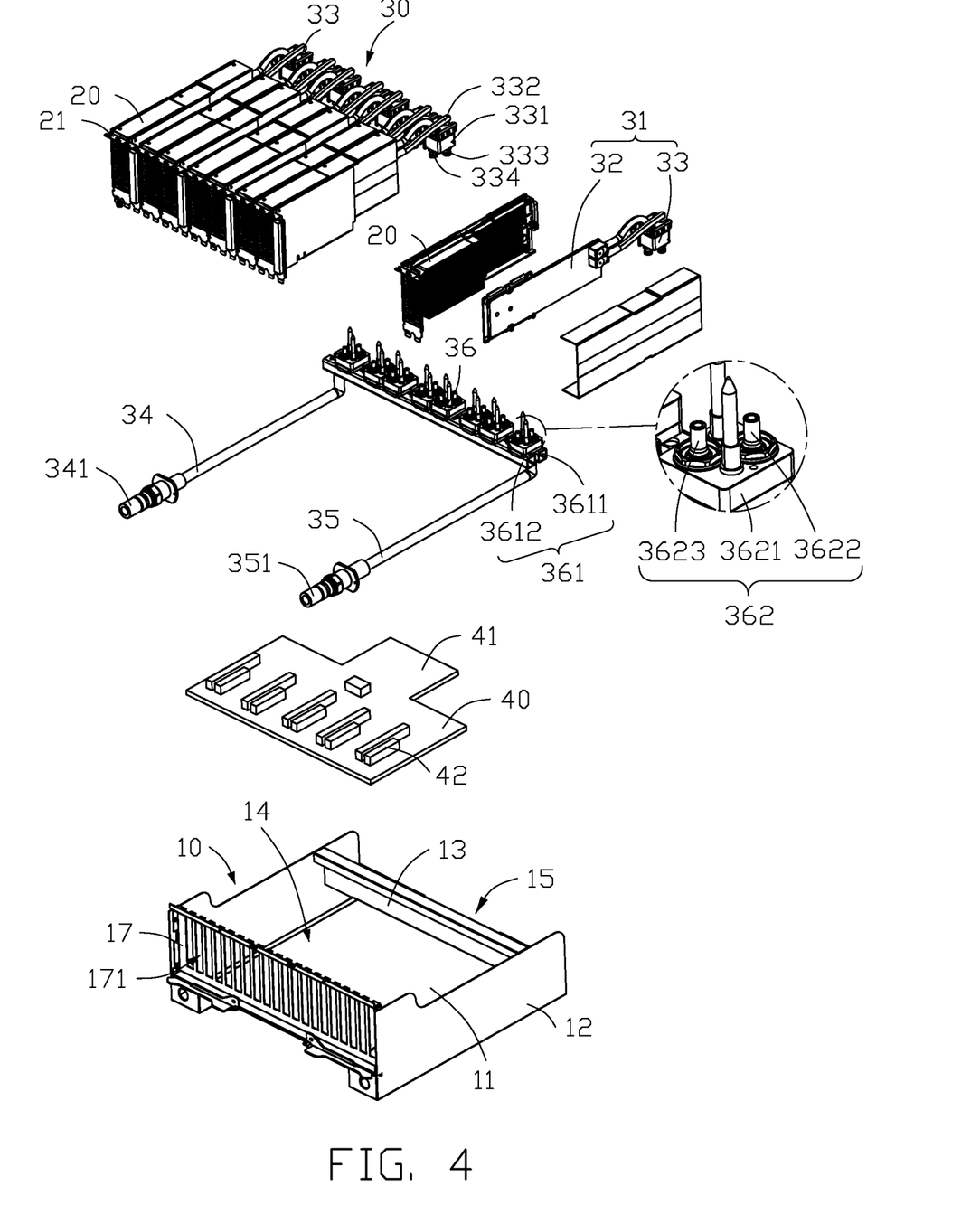
FIG. 4 is an exploded, isometric view of the cooling mechanism in FIG. 3.
Figure 5:
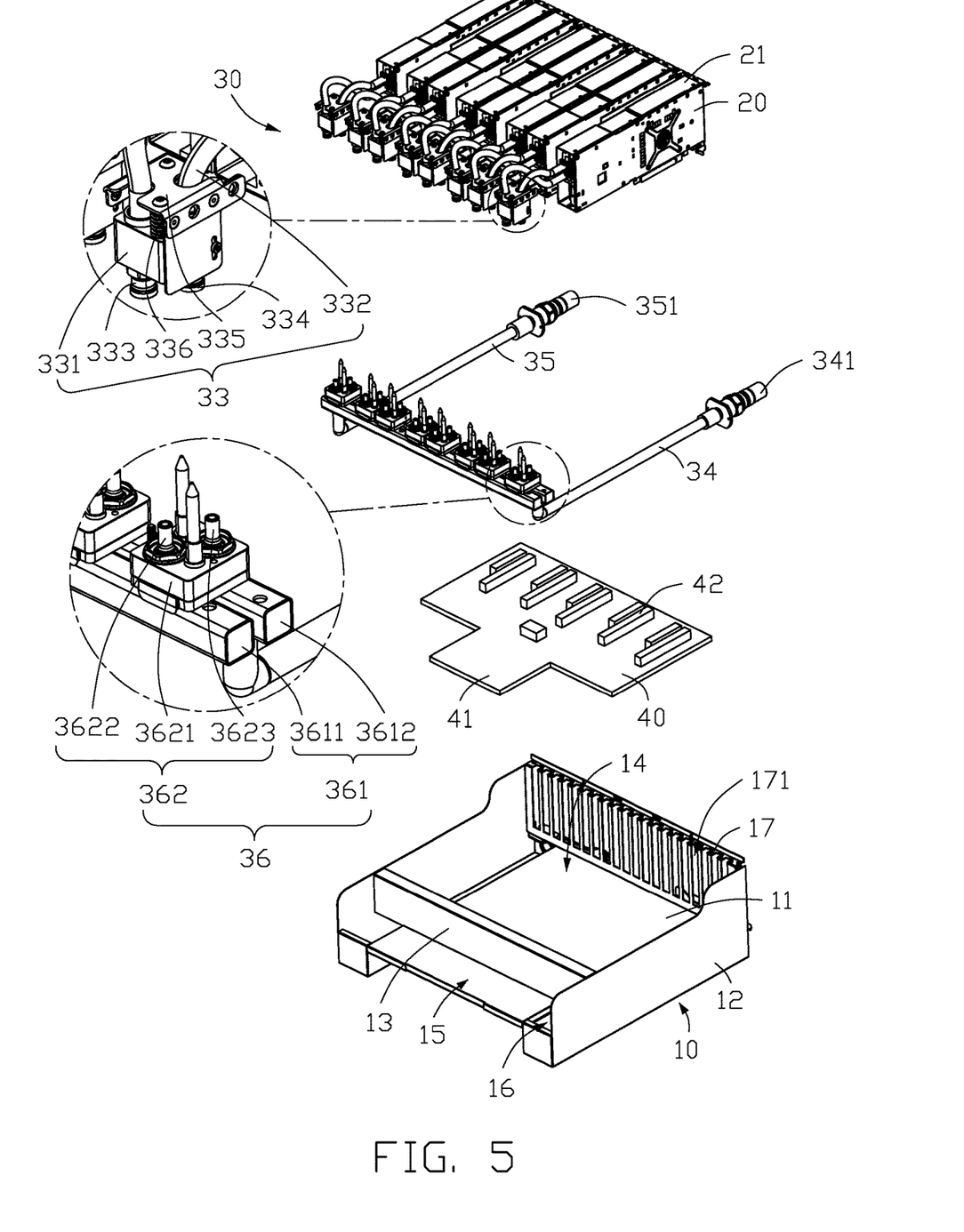
FIG. 5 is similar to FIG. 4, but shown from another angle.

Referring to FIG. 4 and FIG. 5, the mounting frame 10 includes a base plate 11, two side plates 12, and a baffle plate 13. The two side plates 12 are respectively located on opposite sides of the base plate 11 and are disposed substantially perpendicular to the base plate 11. The baffle plate 13 is connected between the two side plates 12, and the baffle plate 13 is substantially perpendicular to the base plate 11 and the two side plates 12. The base plate 11, the two side plates 12, and the baffle plate 13 cooperatively form a first receiving space 14, a second receiving space 15, and a third receiving space 16.

The first receiving space 14 and the second receiving space 15 are respectively formed on opposite sides of the baffle plate 13. The first receiving space 14 is larger than the second receiving space 15, and the third receiving space 16 communicates with the first receiving space 14 and the second receiving space 15. The heating element 20 is received in the first receiving space 14, and the second receiving space 15 and the third receiving space 16 receive the cooling mechanism 30.

The mounting frame 10 further includes a fixing plate 17 provided at an end position of the base plate 11, and the fixing plate 17 is substantially perpendicular to the base plate 11. The fixing plate 17 is provided with a plurality of through holes 171, and each of the plurality of through holes 171 can receive a corresponding heating element 20 therein, so that a plurality of the heating elements 20 can be placed on the mounting frame 10 at the same time.

The heating element 20 includes a fixing portion 21. The fixing portion 21 and the fixing plate 17 are fixed by a fixing means, such as screws, for fixing the heating element 20 on the mounting frame 10. In one embodiment, the heating element 20 is a graphics processing unit (GPU). It can be understood that, in other embodiments, the heating element 20 may be another element that generates heat, such as a processor.

Figure 6:
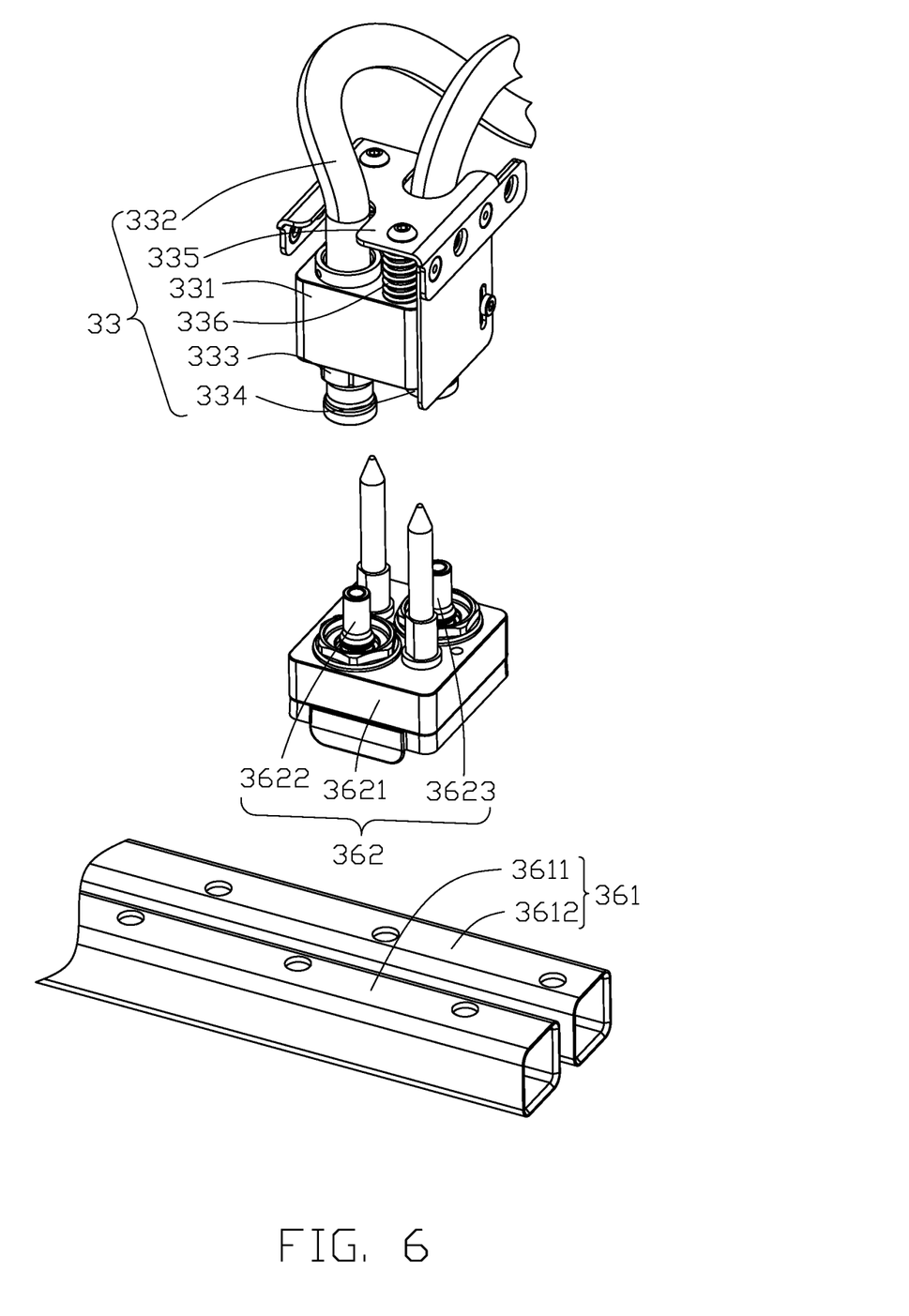
FIG. 6 is an exploded view of a connector and a diverter.

Referring to FIGS. 4-6, the cooling mechanism 30 includes a cooling element 31, an inlet pipe 34, and an outlet pipe 35. The cooling element 31 is disposed on the heating element 20, and the inlet pipe 34 and the outlet pipe 35 are received in the third receiving space 16. It can be understood that, when the inlet pipe 34 and the outlet pipe 35 are directly connected to the cooling element 31, the baffle plate 13 may be omitted, thereby eliminating the second receiving space 15. The cooling element 31 is in communication with the inlet pipe 34 and the outlet pipe 35, so that heat from the heating element 20 is taken away by liquid flowing through the cooling element 31.

The cooling element 31 includes a cooling plate 32 and a connector 33. The connector 33 is provided at an end position of the cooling plate 32, and the cooling plate 32 is received in the heating element 20. The cooling plate 32 may be fixed in the heating element 20 by screwing or riveting. It can be understood that, in other embodiments, the cooling plate 32 can be fixed in the heating element 20 by other means.

A curved channel (not shown) for liquid flow is provided inside the cooling plate 32, and two ports of the channel communicate with the connector 33. Liquid flowing in from the connector 33 passes through the channel inside the cooling plate 32 and then flows out from the connector 33. It can be understood that the channel inside the cooling plate 32 can be designed according to the heating element 20. For example, a shape of the channel can be changed according to a size of the heating element 20.

The connector 33 includes a first fixing piece 331 and two conduits 332. The first fixing piece 331 is provided with a first interface 333 and a second interface 334. The first interface 333 and the second interface 334 can directly communicate with the inlet pipe 34 and the outlet pipe 35, or can communicate with a structure for diverting the inlet pipe 34 and the outlet pipe 35. In this embodiment, the first interface 333 is in communication with the inlet pipe 34, and the second interface 334 is in communication with the outlet pipe 35. One end of a first one of the two conduits 332 is connected to the first interface 333, and another end of the first one of the two conduits 332 is connected to the cooling plate 32. One end of a second one of the two conduits 332 is connected to the second interface 334, and another end of the second one of the two conduits 332 is connected to the cooling plate 32.

The connector 33 further includes a resilient piece 336 and a limiting piece 335. Two ends of the resilient piece 336 are respectively connected to the first fixing piece 331 and the limiting piece 335. If the conduit 332 becomes detached from the first fixing piece 331, the limiting piece 335 can prevent displacement of the conduit 332, and a position of the conduit 332 can be effectively limited by the resilient piece 336 and the limiting piece 335.

In this embodiment, the cooling element 31 is a water-cooled heat sink. It can be understood that, in other embodiments, the cooling element 31 may be another heat dissipating structure having a same function or effect.

The inlet pipe 34 and the outlet pipe 35 are used for conveying liquid. An end of the inlet pipe 34 is provided with a first quick release joint 341, and an end of the outlet pipe 35 is provided with a second quick release joint 351. The first quick release joint 341 is used for communicating with an external structure filled with a cold liquid, such as a cold water pipe. The second quick release joint 351 is used for communicating with an external structure for collecting hot liquid, such as a storage barrel.

The cooling mechanism 30 further includes a diverting assembly 36. The diverting assembly 36 is used for diverting the liquid in the inlet pipe 34 and the outlet pipe 35. The diverting assembly 36 is mounted on the mounting frame 10 in the second receiving space 15. The diverting assembly 36 includes a connecting pipe 361 and a plurality of diverting members 362. The plurality of diverting members 362 are disposed on the connecting pipe 361 and communicate with the connecting pipe 361. The connecting pipe 361 communicates with the inlet pipe 34 and the outlet pipe 35, and each of the plurality of diverting members 362 communicates with a corresponding connector 33.

Referring to FIG. 5 and FIG. 6, the connecting pipe 361 includes a first connecting pipe 3611 and a second connecting pipe 3612. The first connecting pipe 3611 and the second connecting pipe 3612 are arranged side by side on the mounting frame 10. One end of the first connecting pipe 3611 is in communication with the inlet pipe 34, and the other end is sealed. One end of the second connecting pipe 3612 is in communication with the outlet pipe 35, and the other end is sealed. The first connecting pipe 3611 and the second connecting pipe 3612 are in communication with the plurality of diverting members 362 to convey liquid to the cooling plates 32. The first connecting pipe 3611 is a cold shunt pipe, and the second connecting pipe 3612 is a hot shunt pipe.

The each of the plurality of diverting members 362 corresponds to one heating element 20, respectively. The each of the plurality of diverting members 362 includes a second fixing piece 3621, and the second fixing piece 3621 is provided with a third interface 3622 and a fourth interface 3623. The third interface 3622 is in communication with the first interface 333, and the fourth interface 3623 is in communication with the second interface 334. Cool liquid flows from the first connecting pipe 3611 to the first one of the two conduits 332 through the third interface 3622 and the first interface 333, and then flows through the first one of the two conduits 332 to the cooling plate 32. Then, heated liquid flows from the second one of the two conduits 332 to the second connecting tube 3612 through the second interface 334 and the fourth interface 3623. The plurality of diverting members 362 can deliver the cool liquid from the first connecting pipe 3611 to the plurality of heating elements 20, and deliver the heated liquid to the second connecting pipe 3612. Thus, only one inlet pipe 34 and one outlet pipe 35 is needed to convey the cool liquid to the plurality of heating elements 20 and convey the heated liquid away from the heating elements 20.

Referring to FIG. 4 and FIG. 5, the connecting plate 40 includes the plug portion 41 and a coupler 42. The coupler 42 is electrically connected to the connecting plate 40. The connecting plate 40 is mounted in the mounting frame 10. The connecting plate 40 is provided on a surface of the base plate 11. The heating element 20 is detachably connected to the coupler 42. In one embodiment, the connecting plate 40 is a circuit board.

The plug portion 41 extends outside the mounting frame 10 and is used for connecting with an external operating mechanism to control operation of the heating element 20.

Figure 2:
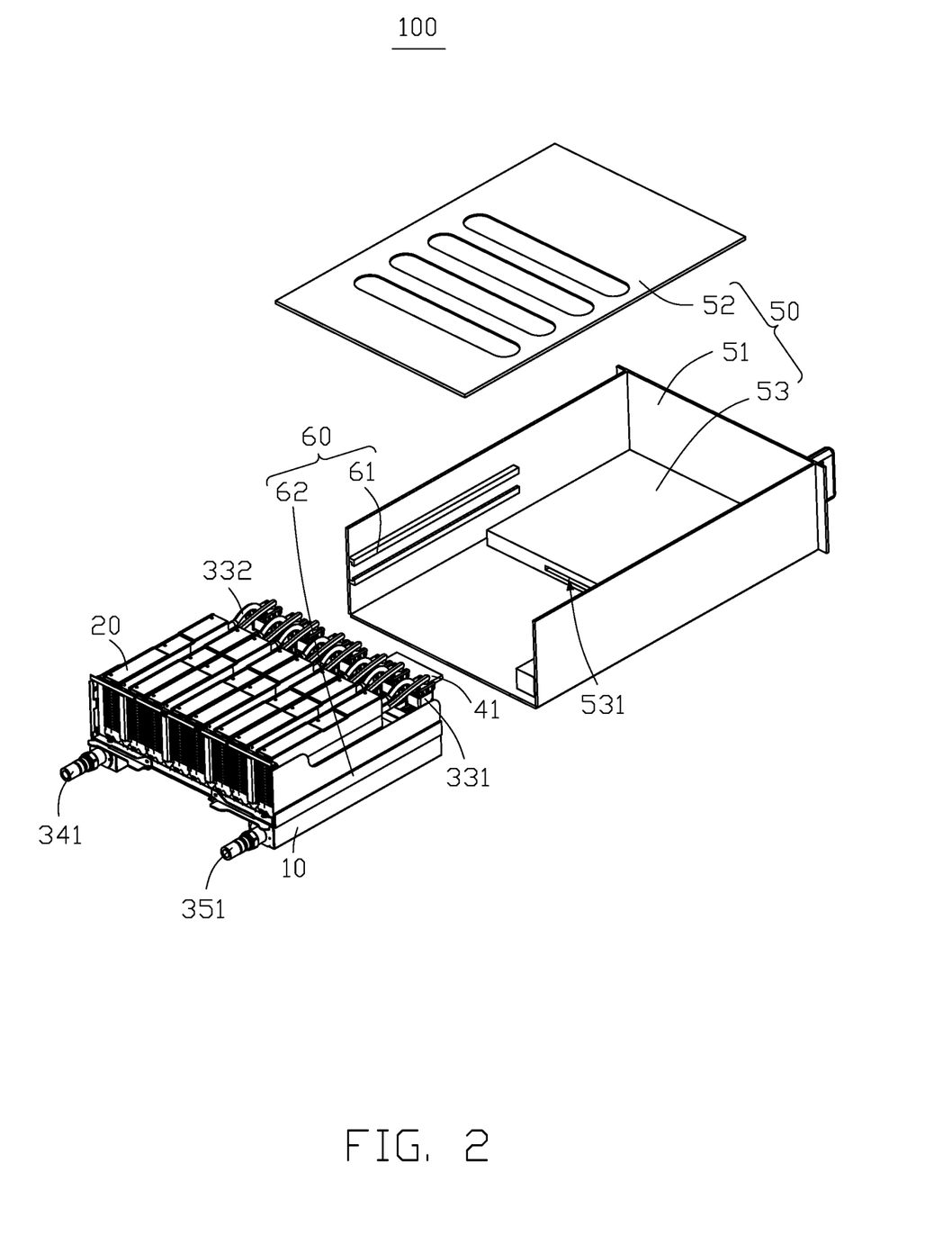
FIG. 2 is an exploded, isometric view of the server in FIG. 1.

Referring to FIG. 2, the case 50 includes a housing 51 and a cover 52, and the operating mechanism 53 is provided in the case 50. The cover 52 covers the housing 51. The operating mechanism 53 is provided with a plug interface 531 corresponding to the plug portion 41 of the connecting plate 40. The plug portion 41 and the plug interface 531 may be connected together through a gold finger. The plug interface 531 is also connected to other structures such as a processor, a hard disk, and a control system provided in the case 50.

When the cooling mechanism 30 is provided in the case 50, the plug portion 41 is plugged in the plug interface 531 so that the heating element 20 is connected to other structures provided in the case 50 to control the operation of the heating element 20.

Referring to FIG. 2, the server 100 further includes a sliding mechanism 60, and the mounting frame 10 is detachably mounted in the case 50 through the sliding mechanism 60. The sliding mechanism 60 includes sliding rails 61 and sliding blocks 62. The sliding rails 61 are provided on side walls of the case 50, and the sliding blocks 62 are provided on side walls of the mounting frame 10. The sliding blocks 62 engage with the sliding rails 61 to enable the mounting frame 10 to slide in the case 50 or slide out of the case 50. It can be understood that, in other embodiments, the mounting frame 10 may be mounted in the case 50 by other mechanisms.

Figure 1:
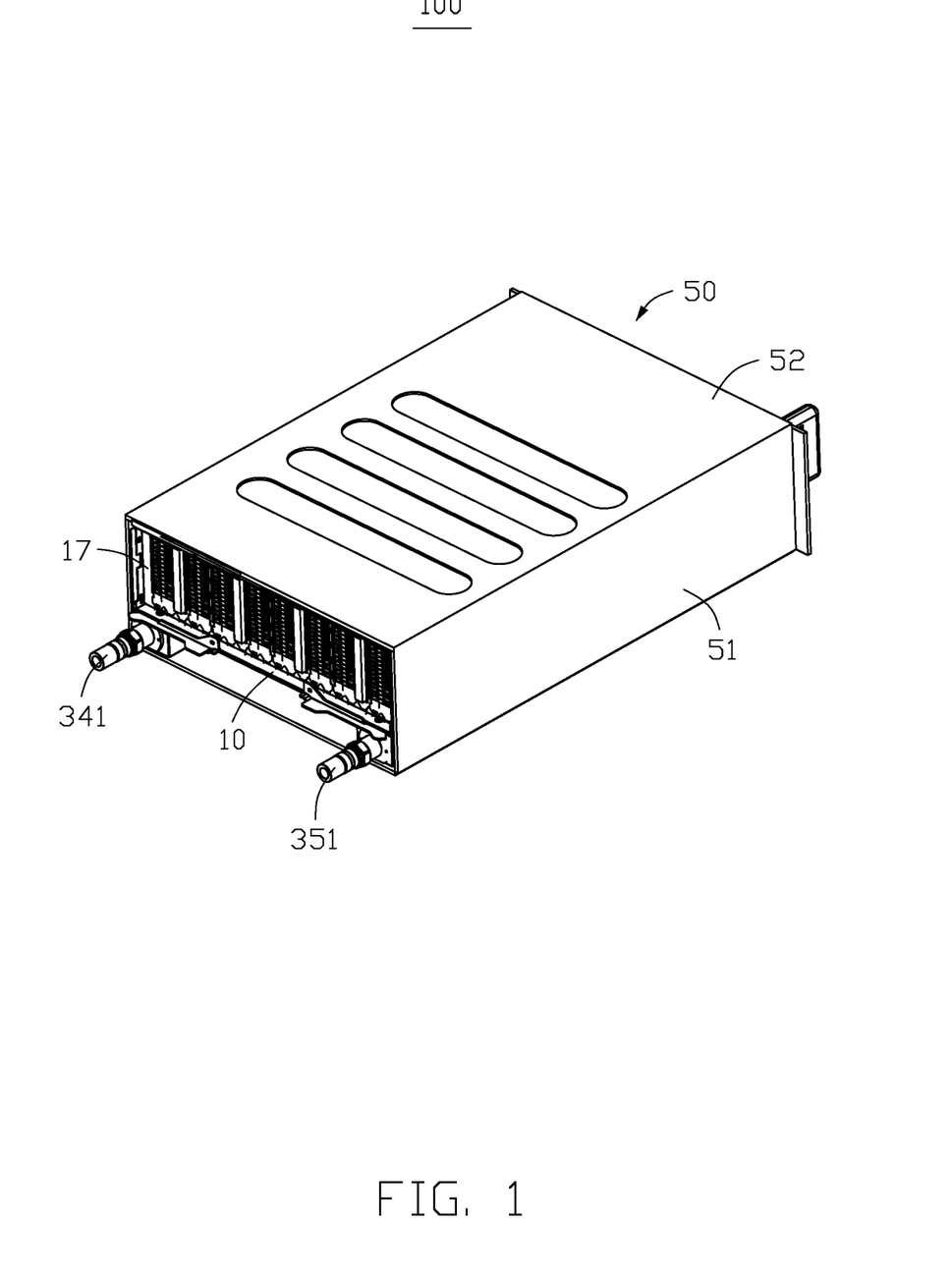
FIG. 1 is an assembled, isometric view of an embodiment of a server.
Figure 3:
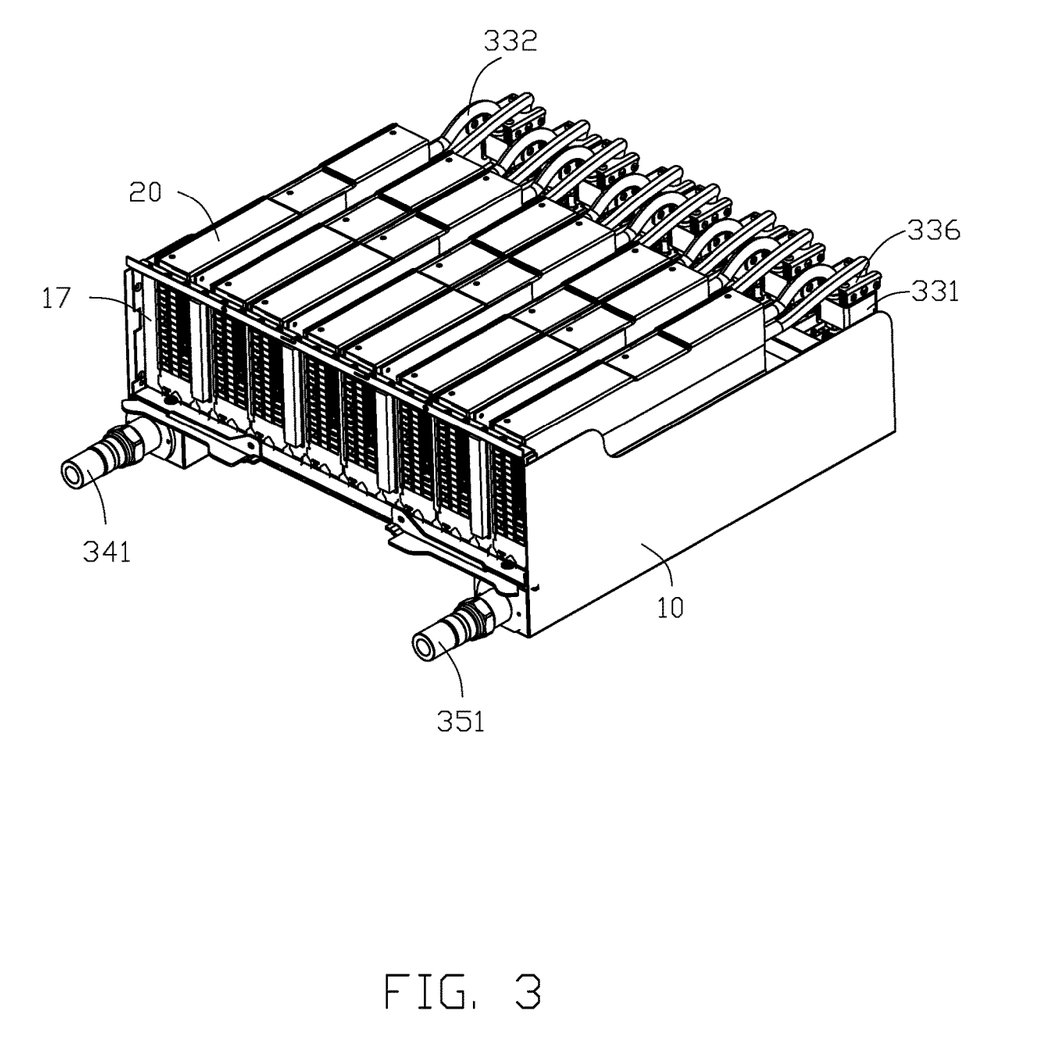
FIG. 3 is an isometric view of a cooling mechanism.

Referring to FIGS. 1-3, in order to dissipate heat of the plurality of the heating elements 20, liquid enters the first connecting pipe 3611 from the inlet pipe 34, and the each of the plurality of diverting members 362 transfers the liquid into the cooling plate 32 through the connector 33. Then, the liquid flows through the cooling plate 32 to carry away the heat generated by each of the plurality of the heating elements 20. Then, the liquid is transferred from the connector 33 to the second connecting pipe 3612 through the each of the plurality of diverting members 362. The second connecting pipe 3612 outputs the liquid carrying the heat to outside the cooling mechanism 30 through the outlet pipe 35. In one embodiment, the liquid is a coolant. In other embodiments, the liquid may be another liquid capable of absorbing heat.

When it is necessary to perform maintenance on one of the heating elements 20, first, the inlet pipe 34 and the outlet pipe 35 are disconnected from the external connection structures, the mounting frame 10 is pulled out from the server 100, and the plug portion 41 is separated from the operating mechanism 53. After the mounting frame 10 is pulled out, the heating element 20 provided with the cooling element 31 is taken out of the mounting frame 10, so that the connection between the cooling element 31 and the diverting assembly 36 is disconnected, and the heating element 20 is disconnected from the cooling element 31, so that the heating element 20 can be maintained.

In summary, the server 100 is provided with the plurality of the heating elements 20 in the mounting frame 10. When one of the plurality of the heating elements 20 needs to be maintained, the mounting frame 10 is directly removed from the case 50, so that the heating element 20 can be separated from the cooling element 31 for maintenance. Thus, the server 100 does not need to be completely removed from the cabinet, and only the mounting frame 10 needs to be taken out, which effectively reduces a maintenance time. The cooling mechanism 30 is disposed in the mounting frame 10 and connected to the heating elements 20 to dissipate heat from the heating elements 20. Furthermore, the cooling element 31 is disposed inside the heating element 20 to improve heat dissipation efficiency of the heating element 20.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A server comprising:
   a case;
   a mounting frame;
   a heating element;
   a connecting plate; and
   a cooling mechanism; wherein:
   the heating element, the connecting plate, and the cooling mechanism are mounted on the mounting frame;
   the heating element is detachably mounted on the connecting plate;
   the cooling mechanism is coupled to the heating element;
   the mounting frame is detachably mounted in the case;
   the connecting plate comprises a plug portion configured to plug with an operating mechanism mounted in the case.

2. The server of claim 1, wherein:
   the cooling mechanism comprises a cooling element, an inlet pipe, and an outlet pipe;
   the cooling element is mounted in the heating element;
   the cooling element is coupled to the inlet pipe and the outlet pipe; and
   the inlet pipe and the outlet pipe are configured to convey a liquid to disperse heat from the heating element.

3. The server of claim 2, wherein:
   the cooling element comprises a cooling plate and a connector;
   the cooling plate is coupled to the connector;
   the cooling plate is located within the heating element; and
   the connector is coupled to the inlet pipe and the outlet pipe.

4. The server of claim 3, wherein:
   the cooling mechanism further comprises a diverting assembly mounted on the mounting frame;
   the diverting assembly comprises a connecting pipe and a diverting member;
   the diverting member is coupled to the connecting pipe;
   the connecting pipe is coupled to the inlet pipe and the outlet pipe; and
   the diverting member is coupled to the connector.

5. The server of claim 4, wherein:
   the connecting pipe comprises a first connecting pipe and a second connecting pipe;
   the first connecting pipe is coupled to the inlet pipe;
   the second connecting pipe is coupled to the outlet pipe; and
   each of the first connecting pipe and the second connecting pipe is coupled to the diverting member.

6. The server of claim 5, wherein:
   the mounting frame defines a first receiving space, a second receiving space, and a third receiving space;
   the third receiving space communicates with the first receiving space and the second receiving space;
   the heating element is located in the first receiving space;
   the diverting assembly is located in the second receiving space; and
   the inlet pipe and the outlet pipe are located in the third receiving space.

7. The server of claim 1, wherein:
   the mounting frame comprises a fixing plate;
   the fixing plate defines a plurality of through holes;
   each of the plurality of through holes is configured to receive a corresponding heating element; and
   the heating element is fixed to the fixing plate.

8. The server of claim 1, wherein:
   the connecting plate further comprises a coupler detachably coupled to the heating element.

9. The server of claim 1, further comprising a sliding mechanism, wherein:
   the mounting frame is detachably mounted in the case through the sliding mechanism.

10. The server of claim 2, wherein:
    the cooling element is a water-cooled heat sink.

11. A server applicable in a cabinet, the server comprising:
a case;
a mounting frame;
a plurality of heating elements;
a connecting plate;
a cooling mechanism; and
a sliding mechanism; wherein:
the plurality of heating elements, the connecting plate, and the cooling mechanism are mounted on the mounting frame;
each of the plurality of heating elements is detachably mounted on the connecting plate;
the cooling mechanism is coupled to the plurality of heating elements;
the mounting frame is detachably mounted in the case;
the connecting plate comprises a plug portion configured to plug with an operating mechanism mounted in the case; and
the mounting frame is detachably mounted in the case through the sliding mechanism.

12. The server of claim 11, wherein:
the cooling mechanism comprises a plurality of cooling elements, an inlet pipe, and an outlet pipe;
each of the plurality of cooling elements is mounted in a corresponding heating element;
the each of the plurality of cooling elements is coupled to the inlet pipe and the outlet pipe; and
the inlet pipe and the outlet pipe are configured to convey a liquid to disperse heat from the plurality of heating elements.

13. The server of claim 12, wherein:
the each of the plurality of cooling elements comprises a cooling plate and a connector;
the cooling plate is coupled to the connector;
the cooling plate is located within the each of the plurality of heating elements; and
the connector is coupled to the inlet pipe and the outlet pipe.

14. The server of claim 13, wherein:
the cooling mechanism further comprises a diverting assembly mounted on the mounting frame;
the diverting assembly comprises a connecting pipe and a plurality of diverting members coupled to the connecting pipe;
the connecting pipe is coupled to the inlet pipe and the outlet pipe; and
each of the plurality of diverting members is coupled to a corresponding connector.

15. The server of claim 14, wherein:
the connecting pipe comprises a first connecting pipe and a second connecting pipe;
the first connecting pipe is coupled to the inlet pipe;
the second connecting pipe is coupled to the outlet pipe; and
each of the first connecting pipe and the second connecting pipe is coupled to the each of the plurality of diverting members.

16. The server of claim 11, wherein:
the mounting frame comprises a fixing plate;
the fixing plate defines a plurality of through holes;
each of the plurality of through holes is configured to receive a corresponding one of the plurality of heating elements; and
the plurality of heating elements is fixed to the fixing plate.

* * * * *